United States Patent [19]

Kuniya et al.

[11] 4,196,442
[45] Apr. 1, 1980

[54] SEMICONDUCTOR DEVICE

[75] Inventors: Keiichi Kuniya; Hideo Arakawa; Kunihiro Maeda; Keiichi Morita, all of Hitachi, Japan

[73] Assignee: Hitachi, Ltd., Japan

[21] Appl. No.: 911,078

[22] Filed: May 31, 1978

[30] Foreign Application Priority Data

Jun. 3, 1977 [JP] Japan .................................. 52-64720

[51] Int. Cl.$^2$ ............................................ H01L 23/48
[52] U.S. Cl. ........................................ 357/67; 357/68; 357/81; 357/74
[58] Field of Search ........................ 357/67, 68, 81, 74

[56] References Cited

U.S. PATENT DOCUMENTS

| 3,889,286 | 6/1975 | De Besis | 357/81 |
| 3,969,754 | 7/1976 | Kuniya et al. | 357/67 |

*Primary Examiner*—Edward J. Wojciechowicz
*Attorney, Agent, or Firm*—Craig and Antonelli

[57] ABSTRACT

A semiconductor device comprises a semiconductor substrate and at least one supporting electrode soldered to one surface of the semiconductor substrate. The supporting electrode is constituted by a composite body having fibers embedded in a matrix of an electrically conductive metal. The coefficient of the thermal expansion of the fibers is substantially equal to or smaller than that of the semiconductor substrate. The fiber is arrayed in an annular, circular, spiral or the like pattern at least in the surface portion of the composite body on which the composite body is bonded to the substrate.

6 Claims, 3 Drawing Figures

SEMICONDUCTOR DEVICE

The present invention relates in general to a semiconductor device and in particular to a semiconductor device including a semiconductor substrate and supporting electrode bonded to at least one surface of the semiconductor substrate.

In the semiconductor device having a substrate formed of silicon, germanium, intermetallic compounds or the like, one of the great problems resides in how to dissipate effectively heat generated in the semiconductor substrate during operation of the semiconductor device. A poor heat dissipation would result in an overheating of the semiconductor substrate beyond an allowable temperature which in turn will incur an undesirable increase in the current leakage as well as lowering of the switching voltage level and lead to unsatisfactory performance and operation of the semiconductor device. The above problem may be solved by disposing the semiconductor substrate on a post of a metal having high electrical and thermal conductivities such as copper, for example. However, because of difference in thermal expansion coefficient between the semiconductor substrate and copper (e.g. the thermal expansion coefficient of silicon is about $3.5 \times 10^{-6}/°C.$ while that of copper is about $16 \times 10^{-6}/°C.$), there will be produced stress at the contact surfaces of the semiconductor substrate and the metal post as bonded together by conventional solder, which stress will possibly destroy the semiconductor substrate which is inherently of a low mechanical strength. Under the circumstance, it is common in practice to provide a supporting electrode having a thermal expansion coefficient substantially euql to that of the semiconductor substrate at the surface of the latter which is brought in contact with the copper post. For the material of the supporting electrode, molybdenum and tungsten are used in most cases. Since these elements have thermal expansion coefficients which differ only slighitly from those of silicon and germanium (i.e. the thermal expansion coefficient of molybdenum is about $5.5 \times 10^{-6}/°C.$ and that of tungsten is about $4.4 \times 10^{-6}/°C.$) and additionally have relatively high electrical and thermal conductivites, the supporting electrode made of molybdenum or tungsten can dissipate effectively heat generated in the semiconductor substrate in most applications, preventing thus the semiconductor substrate from being destroyed.

However, it is of course obvious that molybdenum and tungsten are not always the best material for the supporting electrodes. There is a need for more preferable materials for the supporting electrode in dependence on practical applications particularly in view of the fact that intermetallic componds have been developed as the semiconductor material and that remarkable progress has been made in the fabrication process with emphasis being increasingly put on the miniaturization and light weight of semiconductor devices.

In consideration of the recent technical state of the semiconductor devices, two problems may be enumerated which remain to be solved. The first problem is concerned with the supporting electrode. In order to attain a high capacity in a semiconductor device, it is required that heat generated in the semiconductor substrate be effectively dissipated. This may be readily accomplished by increasing the surface area of the supporting electrode of molybdenum or tungsten. However, such measures apparently contradicts the demand for miniaturization of the semiconductor device. Thus, it becomes necessary to increase the thermal conductivity of the supporting electrode without enlarging the dimension thereof. Another difficulty is found in conjunction with the supporting electrode. More specifically, the semiconductor device is subjected to a high temperature treatment during fabrication by soldering or the like processing. Further, after the fabrication, the semiconductor device is subjected to a thermal cycle to some degree under heat generated in the device during operation thereof. Due to such thermal cycles, the semiconductor or silicon substrate is likely to be bent because of difference in the thermal expansion coefficient between the semiconductor substrate material such as silicon and the supporting electrode material such as molybdennum or tungsten even though the difference is of a small value. Such tendency will become more significant, as the capacity of the semiconductor device becomes higher, in which silicon or the like substrate of greater diameter has to be employed.

The second problem relates to the copper post. As is known, the thermal expansion coefficient of copper is about $16 \times 10^{-6}/°C.$ and differ considerably from that of molybdennum or tungsten forming the supporting electrode. This difference will promote the bending of the semiconductor substrate as caused by the difference in the thermal expansion coefficient between the semiconductor substrate and the supporting electrode when subjected to the thermal cycle described above. Such bending tendency of the semiconductor or silicon substrate may be suppressed by increasing the thickness of the supporting electrode, which exerts however adverse influence to the heat dissipation and contradicts the demand for miniaturization of the semiconductor device of a light weight. Further, because the copper post is softened and degraded in respect of the mechanical strength thereof due to thermal cycle for soldering, welding or the like treatment, bending as well as eventual destruction of the copper post itself is likely to occur under thermal stress ascribable to the difference in the thermal coefficient between the supporting electrode and the copper post.

An object of the invention is to provide a structure of a semiconductor device which is capable of dissipating effectively heat generated in the semiconductor substrate thereby to protect the semiconductor substrate from thermal destruction.

Another object of the invention is to provide a semiconductor device having a supporting electrode, the thermal expansion coefficient of which is equal to or smaller than that of molybdenum or tungsten.

Still another object of the invention is to provide a semiconductor device provided with the supporting electrode, the thermal expansion of which in a first direction parallel to the surface bonded to a semiconductor substrate is made smaller than the thermal expansion in a second direction perpendicular to the first direction.

Further object of the invention is to provide a semiconductor device having a supporting electrode, the thermal expansion coefficient of which in the direction parallel to the surface bonded to the semiconductor substrate is substantially equal to that of the latter and which has higher thermal and electrical conductivites than that of molybdenum or tungsten.

In view of above and other objects which will become more apparent as description proceeds, there is proposed according to a feature of the invention that the supporting electrode bonded to at least one surface of the semiconductor substrate is constituted by a composite body having fibers embedded in a matrix of an electrically conductive metal, the fibers having a coefficient of thermal expansion substantially equal to or lower than that of the semiconductor substrate, and that the fibers located at the surface portion of the composite electrode body bonded to the semiconductor substrate are arranged in a circular, spiral, annular or the like configuration.

In the supporting electrode constituted by the composite body which includes fibers having a thermal expansion coefficient substantially equal to or lower than that of the semiconductor substrate and embedded in a matrix of an electrically conductive metal, following theoretical analyses will apply valid in respect of the electrical and thermal conductivities as well as the thermal expansion coefficient and mechanical strength of the composite electrode.

Assuming by way of example that the fibers are oriented in one direction in the matrix, the mechanical strength $\sigma_c$ of the composite electrode can be expressed as follows:

$$\sigma_c = \sigma_f V_f + \sigma_m(1 - V_f) \quad (1)$$

where $\sigma_f$: mechanical strength of the fiber, $\sigma_m$: mechanical strength of the matrix at the destructive distortion of the fiber, and $V_f$: ratio of content in volume of the fibers.

Thus, in the case of a composite electrode structure constituted by the matrix of copper containing 50% in volume of carbon fibers, then $\sigma_f = 200$ kg/mm$^2$, $V_f = 0.5$ and $\sigma_m = 4.2$ kg/mm$^2$. Accordingly, the strength $\sigma_c$ of the composite electrode is equal to 102 kg/mm$^2$. In this manner, the mechanical strength of the composite body or electrode has a remmakable dependence on the mechanical strength of the fiber, while the matrix serves merely as a medium for transmitting stress to the individual fibers.

In respect to the electrical and thermal conductivites, the composite electrode exhibits the property inherent to the matrix, since the matrix itself is not subjected to the reinforcing or strengthening treatment as is in the case of reinforced alloy through aging but the fibers are employed for reinforcing the mechanical strength of the composite electrode. Accordinlly, in the exemplary case of the composite electrode containing 50% in volume of copper and remaining part of carbon fibers, the electric conductivity of the composite electrode will amount to 50% or a half of the electrical conductivity of the copper matrix, even if the electric conductivity of the carbon fiber is assumed to be zero. In respect of the thermal conductivity, the properties of the copper matrix such as a high thermal conductivity can be retained in the composite electrode.

On the other hand, the thermal expansion coefficient $K_\alpha$ of the composite electrode is given by the following expression:

$$K_\alpha = K_f E_f V_f + K_m E_m(1 - V_f)/E_f V_f + E_m(1 - V_f) \quad (2)$$

where $K_f$: coefficient of thermal expansion of fiber, $K_m$: coefficient of thermal expansion of matrix, $E_f$: Young's modulus of fiber, and $E_m$: Young's modulus of matrix.

It will be seen from the expression (2) that the thermal expansion coefficient of the composite electrode is significantly influenced by the thermal expansion coefficient of the fiber.

From the above discussion, it will be appreciated that the composite structure reinforced by fibers exhibits high electric and thermal conductivities as well as a low thermal expansion and these properties can be varied in an arbitrary manner by varying amount of the fibers as added.

Although the supporting electrode of the composite structure described above does not necessitate three-dimensional isotropy in respect of the thermal expansion coefficient, it is desirable that the surface portion of the electrode which is bonded or contacted to the semiconductor substrate has isotropy as far as possible. Additionally, the surface portion of the supporting electrode bonded or contacted to the semiconductor substrate should proferably have the same thermal expansion coefficient as that of the substrate. Otherwise, local distortion might be produced in the bonded surfaces of the supporting electrode and the semiconductor substrate, involving disadvantageously bending and eventually destruction of the semiconductor substrate.

In view of the fact that the composite structure according to the invention is implemented by embedding fibers in the matrix, it is obvious that properties of the composite structure will be varied in dependence on the direction of orientation of the fibers. In order to attain a two-dimensional isotropy, some measures have to be made on the orientation or array of the fibers. To this end, it may be conceived that fibers cut to an appropriate length are arranged at random in the two-dimensional array. Alternatively, the fiber is prepared in a net-like layer which is then laminated or stacked onto one another with laminated position being alternately offset. However, it is noted that the random array of the short fibers will give rise to bulge or swell of the composite structure. Such phenomenon will take place frequently when the matrix and fibers which are inherently difficult to be metallurgically bonded together are heated beyond a predetermined temperature. For example, in the case of the composite structure of copper matrix and carbon fibers, the bulging will occur upon heating thereof at a temperature beyond about 300° C. For this reason, the random array of short-cut fibers is not preferred. On the other hand, lamination of the net-like fiber layers in a stacked manner with lateral position being offset will encounter difficulty in the process for preparing the net-like fiber layer, involving troublesome treatments. Further, this method will not necessarily result in the two-dimensional isotropy.

In the light of the above facts, the invention teaches an array or orientation of fibers in which each of the fibers is imparted with circular, annular, or spiral configuration and located at least in the surface portion of the composite electrode bonded or contacted to the semiconductor substrate. It is particularly preferred that the center of the semiconductor substrate coincides with or is positioned in the vicinity of the center of the circular fiber. Practically, the center of the annular or circular fiber should not be located at or outside of the peripheral portion of the semiconductor substrate. The presence of the circular or annular fiber will assure the two-dimensional isotropy at least in the plane in which the fiber annulus is present. The process of preparing the annular fibers can be carried out in much easier fabricating manner than the process of preparing the net-like fiber layer. It has been experimentally confirmed that the composite structure having fibers embedded therein in a circular or annular array will not undergo bulging under heating. It is thus practically possible to use advantageously the composite structure as the supporting electrode for the semiconductor device.

The annuluses of fiber may be present either continuously or discontinously in the thickness direction of the supporting electrode, i.e. in the direction perpendicular to the surface on which the electrode is bonded to the semiconductor substrate. Since the thermal expansion in this direction will not exert any remarkable influence to the bending and eventual destruction of the semiconductor substrate, disposition of fibers may be made in a rather arbitrary manner. In this sense, the supporting electrode may be constituted by a plurality of disc-like composite structures stacked onto one another, in which case the annular fiber is discontinuous at the interfaces between the stacked discs.

For the convenience of description, the direction parallel to the plane at which the supporting electrode is bonded to the semiconductor substrate is referred to as the radial direction of the supporting electrode. It should be mentioned that a plurality of annular fibers may or more preferably should be present in the radial direction. In such case, the individual fiber annuluses should have different diameters and be arranged concentrically with one another according to one of the most preferred embodiments of the invention. In the composite structure having the plurality of the annular fibers of a small thermal expansion coefficient disposed concentrically, the thermal expanstion of the composite body will undergo strong restriction of the fibers, so that tendency of the matrix to expand in the radial direction will be suppressed by the surrounding fiber annuluses. When the plurality of fiber annuluses are not arrayed concentrically in the strict sense, the degree of expansion of the composite structure in the radial direction will be correspondingly varied. However, substantially no variation will occur in the radial expansion of the composite structure when the fiber annuluses are arrayed in the concentrical pattern, and additionally the two-dimensional isotropy can be assured also in respect of other properties.

In the embodiment of the invention in which a plurality of annular or circular fibers of a metal having a thermal expansion coefficient substantially equal to or smaller than that of the semiconductor substrate are arrayed in the concentrical configuration, radial distance between the individual fiber annuluses and hence the number of the fiber annuluses in the radial direction may be selected arbitrarily.

Each of the fiber annuluses may be formed by a plurality of single fibers bundled or twisted.

The content or total amount of the fibers contained at least in the portion of the supporting electrode at which it is bonded to the semiconductor substrate should be in the range of 10 to 55 vol. % and preferably in the range of 20 to 40 vol. %. In the case of the composite electrode in which carbon fibers are embedded in a copper matrix, the content of the carbon fibers less than 10 vol. % will result in a excessively larger thermal expansion coefficient of the composite structure as compared with that of silicon. On the other hand, the content of carbon fibers greater than 55 vol. % will incur a problem in respect of the thermal conductivity. When the content of carbon fibers lies in the range of 25 to 40 vol. %, the thermal expansion coefficient of the composite electrode structure will closely approximate to that of silicon and exhibit an excellent thermal conductive property. More preferably, the maximum difference in thermal expansion coefficient between the composite electrode and silicon is controlled to a value of difference in thermal expansion coefficient between silicon and tungsten or molybdenum by adjusting volume of carbon fibers. That is, the maximum difference should be within a range of $|\alpha_{si}-\alpha_{mo}|=1.2\times10^{-6}/°C.$ or $|\alpha_{si}-\alpha_{w}|=0.9\times10^{-6}/°C.$, where $\alpha_{si}$, $\alpha_{mo}$, and $\alpha_{w}$ represent the thermal expansion coefficient of silicon, molybdenum and tungsten. To this end, the volume of carbon fibers should be of 20 to 40%. By way of example, it has been experimentally found that a composite structure containing 30 vol. % of annular carbon fibers embedded in the copper matrix has a thermal expansion coefficient of about $4.5\times10^{-}/°C.$ and an electrical conductivity which corresponds to about one half of that of copper.

The fiber may be implemented in a spiral configuration in the radial plane of the supporting structure. Accordingly, it is intended that the term "annular" or "circular" is herein used in a broad sense so as to encompass a spiral or the like configuration. In an embodiment of the invention in which a single spiral fiber is employed, the supporting electrode exhibits the two-dimensional isotropy in respect of the various properties in the radial direction thereof and has a reduced thermal expansion, as is in the case of the composite structure in which the plurality of annular fibers are arrayed concentrically. Further, spiral configuration of the fiber facilitates advantageously the preparation of the composite structure for the supporting electrode.

In carrying out the invention, copper, aluminium, silver or alloys containing either of these elements as a main component may be advantageously employed for the electrically conductive metal for the matrix. In the case where an alloy is used, care should be paid so as not to lower excessively the electrical conductivity of the matrix. Copper is preferred for the matrix material of the composite electrode structure in view of the high electric conductivity and inexpensiveness. When the semiconductor substrate is made of silicon, carbon fiber is best suited for the fiber embedded in the metal matrix. Although molybdenum and tungsten may be employed, the carbon fiber is preferred over them in view of the smaller thermal expansion coefficient than those of molybdenum and tungsten.

When materials which are metallurgically difficult to be bonded together are selected for the matrix and the fibers as in the case of combination of the copper matrix and the carbon fibers, it is preferred that the matrix contains additionally such a metal which forms a compound at the interfaces between the matrix and the fibers. For example, in the case of the combination of copper matrix and carbon fibers, the matrix may contain therein a metal which forms a carbide. Such metal may be selected from niobium, zirconium, vanadium and titanium. These elements are capable of forming carbides at the interfaces with the carbon fibers and additionally combining metallurgically with the matrix.

Method of manufacturing the composite structure in which the fibers are arrayed in the annular or circular configuration may be carried out in the manners described below.

According to a first method, a material for the matrix is coated on the surfaces of fibers through plating which are then shaped in annular configuration and subsequently bonded together through hot-pressing. According to a second method, powder of a metal material for the matrix is admixedly added to a slurry in which the annular fibers are potted or immersed. Subsequently, the annular fibers coated now with the slurry are pressed. The first method is particularly useful in the case in which the matrix of a pure metal is to be employed. The second method is suited for the matrix of pure copper or alloy matrix, wherein suitable elements may be contained in the slurry. Of course, the first method may be combined with the second method in such a manner that the fibers coated with a matrix material is potted or immersed in the slurry. It is advantageous that short fibers for decreasing the iner-fiber thermal expansion coefficient are admixed.

Now, the invention will be described in conjunction with the preferred examples by referring to the accompanying drawings, in which.

EXAMPLE 1

Figure 1:
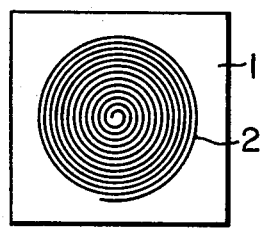
FIG. 1 is a plan view showing an exemplary embodiment of a composite structure for a supporting electrode of a semiconductor device according to the invention.

A carbon fiber of 9 $\mu$m in diameter was coated with copper in thickness of 0.2 $\mu$m and wound around a conically pointed rod of a circular cross-section in a spiral pattern. Subsequently, hot press was effected in the atmosphere of hydrogen at temperature of 800° C. under pressure of 300 kg/mm$^2$ so as to remove the rod. Then, a composite structure containing 50 vol. % of carbon was obtained, which is shown in FIG. 1. As can be seen from this figure, the spiral spaces among the turns of the spiral carbon fiber 2 was filled with copper 1 formed integrally therewith.

The measurement showed that the linear thermal expansion coefficient of the composite structure is $2.5 \times 10^{16/°}$ C. in the temperature range of a room temperature to 300° C. The electrical conductivity is substantially equal to 30% of that of copper.

EXAMPLE 2

A composite structure was prepared in the same manner as the preceding Example 1 except that the carbon content thereof was 40 vol. %.

The linear thermal expansion coefficient of the composite structure was $3.5 \times 10^{-6}$/°C. as measured in the temperature range of a room temperature to 300° C.

EXAMPLE 3

Pulverized copper of 2 $\mu$m in particle size and pulverized zirconium of 4 $\mu$m in particle size were mixed together, added with an aqueous solution of 3 wt. % (% by weight) of methyl cellulose and agitated to form a slurry. On the other hand, a carbon fiber of 9 $\mu$m in diameter was prepared by winding it around a conically pointed circular ro1 in a spiral pattern and potted in the slurry. Subsequently, hot press was effected in the atmosphere of hydrogen at temperature of 800° C. under pressure of 300 kg/mm$^2$ so as to remove the rod from the carbon fiber, and a composite structure having a spiral carbon fiber and containing 47 vol. % of carbon and 10 vol. % of zirconium was obtained.

The linear thermal expansion coefficient of the composite structure was $2.6 \times 10^{-6}$/°C. as measured in the temperature range of a room temperature to 300° C.

EXAMPLE 4

A composite structure was prepared in the utterly same manner as the preceding Example 3 except that the carbon content was 40 vol. % while the zirconium content was 10 vol. %.

Figure 2:
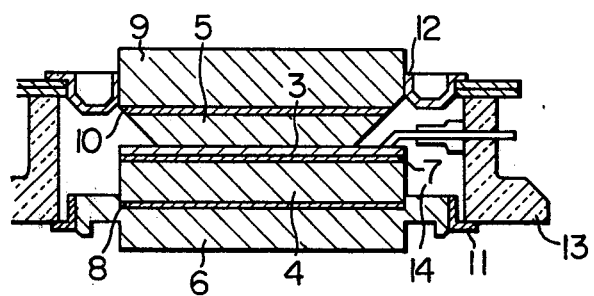
FIG. 2 is a side view of a semiconductor device with portions being shown in section.

The obtained composite structure was incorporated in a semiconductor device by bonding the surface portion in which the spiral fiber lies to a semiconductor substrate thereby to form a thyristor. FIG. 2 is a side view of the fabricated thyristor with portions shown in section. The semiconductor substrate 3 is made of silicon which is provided with supporting electrodes 4 and 5 of the composite structure described above at opposite sides thereof. The supporting electrode 4 has one surface soldered to the semiconductor substrate 3 by Al and the other surface soldered to a copper post 6 by Ag. Reference numerals 7 and 8 denote the soldering layers. The other supporting electrode 5 has one surface merely contacted to the substrate 3 and the other surface bonded to a copper post 9 by soldering 10 of Ag. The copper posts 6 and 9 are welded to Fernico members 11 and 12 at respective side portions thereof, which members in turn are bonded to a glass body 13. The Fernico members 11 and 12 and the glass element 13 serve to protect the semiconductor substrate 3 from the ambient atmosphere. Nitrogen gas is sealingly filled in the space 14 enclosed by the parts 11, 12 and 13.

In the thyristor of the structure described above, there arises substantially no difference in the thermal expansion between the semiconductor substrate and the supporting electrode. Thus, neither bending nor destruction occurred in the semiconductor substrate regardless of the fact that the substrate was subjected to considerably high temperatures during the fabrication of the thyristor.

EXAMPLE 5

By using the composite structure obtained in the Example 2 for the supporting electrodes, a thyristor of the same structure as that of the Example 4 was fabricated. Neither bending nor destruction occurred in the semiconductor substrate as was in the case of the Example 4.

EXAMPLE 6

About 3000 carbon fibers each having a diameter of 9 $\mu$m and plated with copper in thickness of 1 $\mu$m were bundled together and immersed in a slurry containing an aqueous solution of methyl cellulose and pulverized copper in a particle size of about 2 $\mu$m. Subsequently, the carbon fiber bundle was wound in a spiral configuration and solidified by drying at a room temperature. In this manner, composite structures having a diameter of about 29 mm and containing 10, 20, 30, 40 and 50 vol. % of the carbon oxides, respectively, were prepared. The composite structures were placed in a graphite mold of a diameter of 30 mm and hot press treatment was effected in the atmosphere of nitrogen at a temperature of 900° C. for an hour under pressure of 250 to 300 kg/mm$^2$, thereby to form a block of the composite structures having a diameter of 30 mm and a length of about 20 mm.

Figure 3:
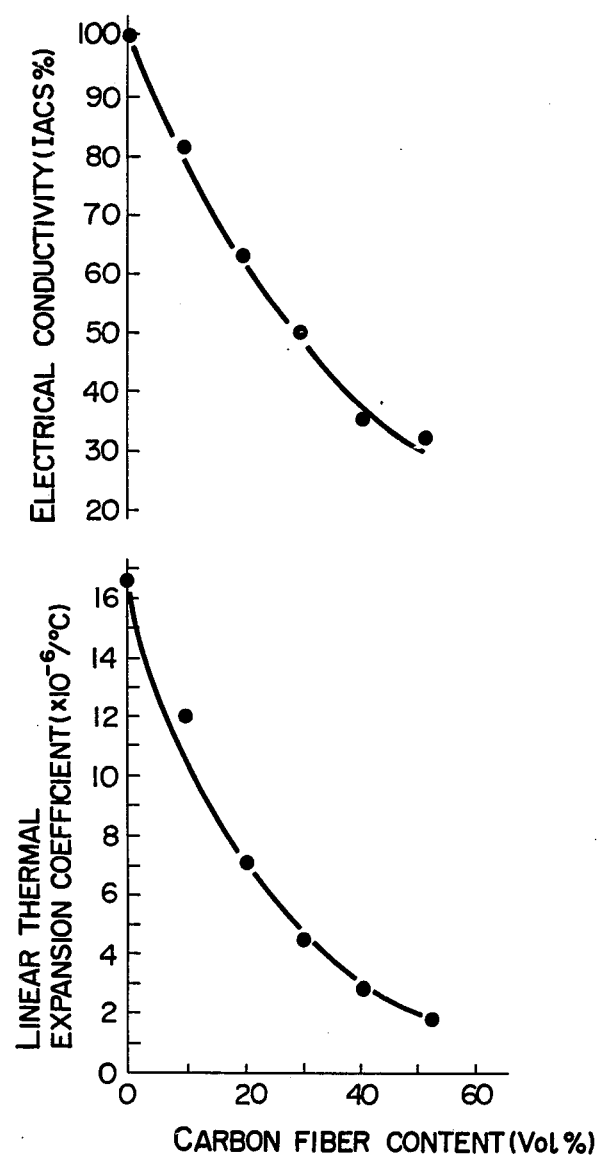
FIG. 3 shows graphs to illustrate relations of the linear thermal expansion coefficient and the electrical conductivity to the amounts of carbon fiber in the composite electrode structure according to the invention.

A specimen of 25 mm in diameter and 4.6 mm thick was cut away from the block for use as the supporting electrode and the thermal expansion coefficient as well as electrical conductivity thereof in the radial direction were measured. FIG. 3 shows graphs illustrating, respectively, the linear thermal expansion coefficients and the electrical conductivities in the radial direction on an average as measured in the temperature range of a room temperature to 250° C. No anisotropy was found in respect of the linear thermal expansion coefficient. It will be seen from FIG. 3 that, in order to decrease the linear thermal expansion coefficient, carbon fiber content is to be increased. The linear thermal expansion coefficient equal to that of silicon can be obtained in the content range of carbon fiber from 30 to 40 vol. %. On the other hand, in order to maintain the electrical conductivity at a high value, the amount of carbon fiber is to be decreased. Thus, it is important to define the range of the carbon fiber content in order to meet the requirement of high electrical conductivity and low thermal expansion coefficient. The invention proposes to use the carbon fiber in the content range of 10 to 55 vol. % and preferably in the content range of 25 to 40 vol. %.

The composite structure containing 30 vol. % of carbon fiber was coated with nickel in a thickness of about 10 μm through plating and bonded to a silicon substrate having a diameter of about 25 mm and a thickness of about 0.2 mm through soldering by an alloy of Pb-Sn-Ag. Thereafter, the curvature at a lateral side of the substrate was measured to be less than 5 mm, which corresponds to one-ninth of the bending as produced in a corresponding silicon substrate to which a copper post was directly bonded.

EXAMPLE 1 FOR REFERENCE

Pulverized Zr of 4 μm in particle size and pulverized Cu of 2 μm in particle size were mixed together with an aqueous solution containing 3 wt. % of methyl cellulose in a mixer to prepare a slurry. On the other hand, carbon fibers each having a diameter of about 9 μm and coated with Cu in thickness of about 0.2 μm were cut to a length in the range of 5 mm to 10 mm. The fibers were then potted in the slurry containing Zr and Cu powders. The mixture composed of Zr powder, Cu powder and carbon fibers were mixed and a composite structure of Cu-Zo vol. % of Zr-45 vol. % of C was prepared through a hot press treatment in the atmosphere of nitrogen gas at 800° C. under pressure of 300 kg/mm$^2$.

A specimen of 20 mm in diameter and 5 mm thick was cut from the composite structure of Cu-10 vol. % of Zr-50 vol. % of C and the thermal expansion coefficient of the specimen was measured in the atmosphere of nitrogen gas through a thermal cycle of heating and cooling in the temperature range of a room temperature to 800° C. The linear thermal expansion coefficient of the specimen in which the carbon fibers were arrayed at random was found to be $4.5 \times 10^{-6}$/°C. at the temperature of 300° C. The electrical conductivity as measured was 25% of that of copper.

EXAMPLE 2 FOR REFERENCE

Carbon fibers of 9 μm in diameter each coated with copper of about 0.2 μm thick were cut to a length in the range of 5 to 10 μm and subjected to a hot press at 800° C. in the atmosphere of hydrogen gas thereby to prepare a composite structure of Cu-50 vol. % of C in which carbon fibers are arrayed at random. In the measurement under the same conditions as the preceding Example 1 for reference, thermal deformation, bulging and/or destruction of the specimens occurred at a temperature on the order of 400° C.

We claim:

1. A semiconductor device including a semiconductor substrate and a supporting electrode bonded to at least one surface of said semiconductor substrate, wherein said supporting electrode comprises a composite body having fibers embedded in substantially uniform distribution in a matrix of an electrically conductive metal, the coefficient of thermal expansion of said fibers being substantially equal to or smaller than that of said substrate, with said fibers being arrayed in an annular configuration having a plurality of annuluses, in at least a surface portion of said composite body at which said composite body is bonded to said semiconductor substrate, said annuluses being arranged substantially in parallel with said surface portion and concentrically around a center of said surface portion.

2. A semiconductor device as set forth in claim 1, wherein said fibers are arrayed in a spiral-like configuration at said surface portion of said composite body.

3. A semiconductor device as set forth in claim 1, wherein said electrically conductive metal is copper, and said fiber is a carbon fiber.

4. A semiconductor device as set forth in claim 1, wherein said metal matrix contains additionally therein in solid phase at least one metal element which chemically combines with said fiber to form a comound.

5. A semiconductor device as set forth in claim 1, wherein said metal matrix contains copper as a main component and additionally at least one metal element which forms a carbide, and said fiber is a carbon fiber.

6. A semiconductor device as set forth in claim 5, wherein said metal element is zirconium.

* * * * *